United States Patent [19]
Ishibashi

[11] Patent Number: 5,451,479
[45] Date of Patent: Sep. 19, 1995

[54] METHOD OF FORMING A PATTERN OF A MULTILAYER TYPE SEMICONDUCTOR DEVICE

[75] Inventor: Takeo Ishibashi, Hyogo, Japan

[73] Assignee: Mitsubishi Denki Kabushiki Kaisha, Tokyo, Japan

[21] Appl. No.: 230,927

[22] Filed: Apr. 21, 1994

[30] Foreign Application Priority Data

Apr. 26, 1993 [JP] Japan ................................. 5-099572
Apr. 13, 1994 [JP] Japan ................................. 6-074762

[51] Int. Cl.⁶ ................................................ G03F 9/00
[52] U.S. Cl. ...................................... 430/22; 430/312; 430/313; 430/322
[58] Field of Search .................... 430/22, 312, 313, 322

[56] References Cited

U.S. PATENT DOCUMENTS 5,252,414  10/1993  Yamashita et al. ................... 430/22

FOREIGN PATENT DOCUMENTS 63-81818   4/1988  Japan .
1-283927  11/1989  Japan .
2-310912  12/1990  Japan .

*Primary Examiner*—S. Rosasco
*Attorney, Agent, or Firm*—Lowe, Price, LeBlanc & Becker

[57] ABSTRACT

In a method of forming a pattern of a multilayer type semiconductor device according to the present invention, reference marks are formed in advance by positioning of a stage on a semiconductor wafer 300, positions of those reference marks are compared with positions of first alignment marks for measuring an error of a first exposure apparatus. After correcting the error, a second layer is formed with a second exposure apparatus, and positions of the reference marks are compared with positions of second alignment marks provided on the second layer for measuring an error of the second exposure apparatus. In other words, there is provided the method of forming patterns of the multilayer type semiconductor device allowing measurement of an error due to a lens distortion readily included in each layer by forming reference marks in advance on the semiconductor wafer for measuring the lens distortion included in each layer.

21 Claims, 19 Drawing Sheets

FIG.5
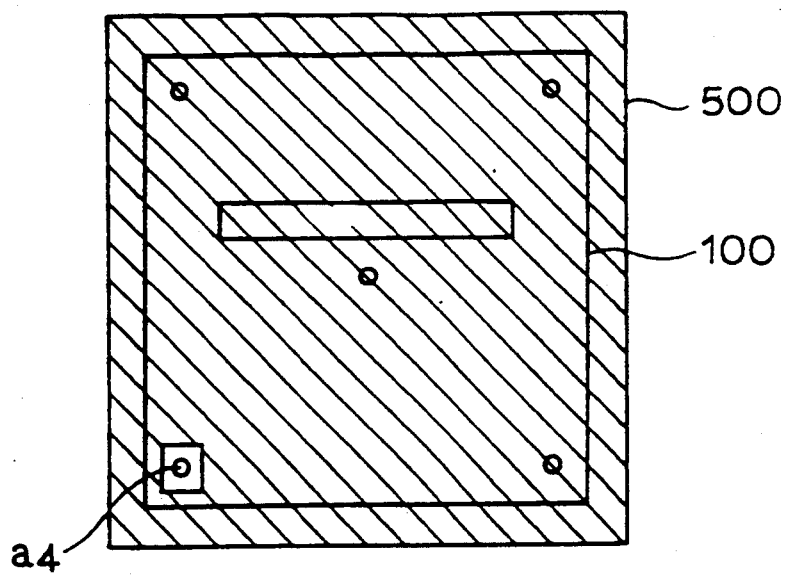
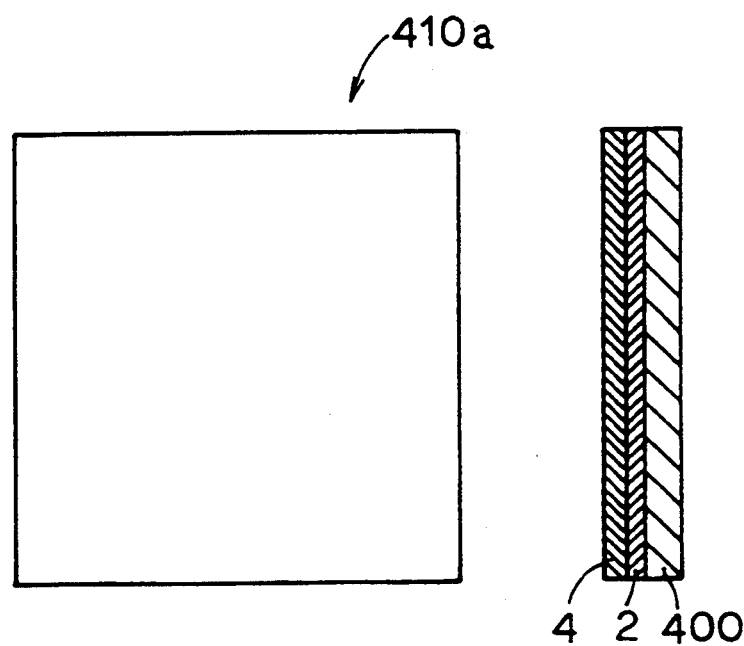
FIG. 6(a)   FIG. 6(b)

METHOD OF FORMING A PATTERN OF A MULTILAYER TYPE SEMICONDUCTOR DEVICE

BACKGROUND OF THE INVENTION

1. Field of the Invention

The present invention relates to a method of forming a pattern of a multilayer type semiconductor device, and more particularly, it is concerned with a method of forming a pattern of a multilayer type semiconductor device, which allows improvement of accuracy in overlaying respective layers.

2. Description of the Background Art

Since the minimum processing size of a semiconductor device has been reduced from 1.0 μm to 0.8 μm and further down to 0.5 μm, an accuracy in overlaying respective layers of a semiconductor device formed by stacking multiple layers has become more important. At present, an overlaying accuracy of ⅓–¼ of the minimum processing size is required.

In the meantime, as to reduction projection aligners, 1:5 reduction projection aligners have come to be used instead of 1:1 projection aligners.

In a method of exposure utilizing reduction projection aligners, first an exposure light emitted from a light source transmits through a photomask in which a predetermined pattern is formed on a transparent substrate, and then is reduced by a reduction lens having a high resolution (mainly a reduction ratio of 1:5) for projecting the pattern image onto regions arranged in a matrix, so-called chip regions 310, of a semiconductor wafer 400 (see FIG. 20). Then, by moving the wafer repeatedly in X and Y directions, i.e., a step and repeat operation, the pattern is exposed on chip regions on the entire surface of the wafer.

Since exposure of the pattern is carried out for every chip forming region on the semiconductor wafer in this exposure method, the number of the semiconductor wafers capable of being processed in a unit time is reduced. However, there are advantages in this exposure method as follows:

i) a resolution of the pattern is superior,
ii) positioning can be carried out with a high accuracy because of a laser gauge interferometer used for controlling a position of the semiconductor wafer,
iii) position control can be carried out every time the pattern image is exposed on the chip region; the focussing position of the pattern image can be adjusted every time exposure is carried out on the chip region, and
iv) insufficient exposure due to the photomask will not occur unless the photomask has defects.

The above mentioned exposure method utilizing reduction projection aligners is disclosed in, for example, Japanese Patent Laying-Open No. 1-283927. The exposure method utilizing the reduction projection aligner will be described in brief below with referring to the drawings.

First referring to FIG. 21, a reduction projection aligner 500 includes a mercury lamp 550 surrounded by an oval mirror 551, a reflection mirror 552, an integrator 553, a reflection mirror 554, a condenser lens 555, a photomask 556, a reduction lens 557, a semiconductor wafer 558, and an X-Y stage 559.

An exposure light 550a emitted from mercury lamp 550 is collected by oval mirror 551 and directed to reflection mirror 552. Exposure light 550a is reflected from reflection mirror 552 to enter on integrator 553. Integrator 553 includes a plurality of fly eye lenses (not shown) for uniforming the light intensity of exposure light 550a.

Exposure light 550a transmitted through integrator 553 is reflected from reflection mirror 554 to be incident on condenser lens 555. Exposure light 550a is then directed to photomask 556 in which a predetermined pattern is formed. Exposure light 550a transmitted through integrator 553 is uniformly directed to the entire surface of photomask 556 by condenser lens 555.

Exposure light 550a transmitted through photomask 556 is reduced at a predetermined reduction ratio (1:m) by reduction lens 557 and the image is projected onto the surface of semiconductor wafer 558 so that a resist film on semiconductor wafer 558 is exposed.

Next referring to FIG. 22, X-Y stage 559 moves and stops repeatedly by a prescribed distance in X direction or Y direction, and when the X-Y stage stops, a predetermined pattern image is exposed on the predetermined chip region 310 with exposure light 550a exposing a resist film on the surface of semiconductor wafer 400. A plurality of chip regions 310 arranged in a matrix are thus formed on semiconductor wafer 400.

Next, description will be made on a method of exposing a semiconductor device formed by stacking a first layer having a first pattern and a second layer having a second pattern, utilizing the above-described reduction projection aligner 500.

Referring to FIG. 23, a first photomask 70 having a first pattern and a second photomask 71 having a second pattern, both used in the exposure method, are described. Alignment mark patterns 70a, 70b, 70c, and 70d (71a, 71b, 71c, and 71d) are formed at predetermined positions in regions except for pattern forming regions on first photomask 70 and second photomask 71, respectively.

In the meantime, a first layer and a first resist film covering the first layer are formed on the semiconductor wafer. With a first exposure apparatus provided with first photomask 70, the first pattern image is exposed on the surface of the first resist film. Then, the first resist film is developed, and the first layer is patterned using the first resist film as a mask.

Semiconductor wafer 400 is taken from the first exposure apparatus and a second layer and a second resist film are formed on the semiconductor wafer. After that, semiconductor wafer 300 is placed on a second exposure apparatus.

After that, positions of alignment marks 70A–70D formed on the first layer are detected. Detection of those alignment marks 70A–70D is carried out by optical measurement such as detection using a laser beam in the dark field, a multicolor light in the light field, or a heterodyne interference light.

Referring to FIG. 24, a brief description will be given for an alignment mark detector 600 using the laser beam in the dark field for detection. First semiconductor wafer 400 is placed at a predetermined position on an X-Y stage 610. X-Y stage 610 moves in X and Y directions with recognizing coordinates accurately with the laser interferometer. A laser beam emitted from an LSA laser 620 passes through a projection lens 630 to be condensed onto each alignment mark (70A–70D) formed on chip region 310 on the semiconductor wafer. The light reflected from those alignment marks (70A–70D) are introduced to an accurately-disposed detector so that only refraction components are detected for identifying position coordinates of alignment marks (70A-70D).

The exposure of the second pattern image is then carried out based on alignment marks 70A-70D of which positions have been detected as above, and subsequently, development of the second resist film and patterning of the second layer are carried out.

If it is desired to stack additional layers having predetermined patterns, the positions of the alignment marks formed on the layer directly under such a lower layer of which overlaying accuracy is important should be detected, and the exposure of the predetermined pattern image can be carried out based on those alignment marks.

However, there is a problem in the above-described exposure method as follows. Referring to FIG. 25, when the first pattern is exposed onto the first layer using the first exposure apparatus, an exposure error is incurred by the first exposure apparatus. A major reason for this error is called a lens distortion in which the pattern image is deformed by the lens.

Therefore, alignment marks (70A-70D) are originally designed to be formed on the positions indicated by dotted lines in the drawing. In practice, however, alignment marks (70A'-70D') are formed on the positions indicated by solid lines during exposure.

If alignment is carried out based on those alignment marks (70A'-70D') which are offset from the design positions, a pattern on a layer to be aligned will be moved in a direction alignment marks are offset. This leads to a significant alignment offset between respective layers, so that miniaturization requirement of the semiconductor device cannot be attained.

One way to solve such a problem is, for example, the exposure method disclosed in Japanese Patent Laying-Open No. 63-81818. This exposure method is aimed to measure in advance the lens distortion involved in the exposure apparatus. This exposure method will be described below referring to FIGS. 26-29 showing manufacturing steps.

Referring to FIG. 26, a first pattern and first alignment mark patterns 600a-600e are included in predetermined positions of a photomask 600. A first layer is formed on a semiconductor wafer 400 provided for measurement of the lens distortion, and then a first resist film is formed on the first layer.

Using the photomask 600, images of the first alignment mark patterns 600A-600E are exposed on the resist film as shown in FIG. 27.

Referring to FIG. 28, photomask 600 is covered by a blind 700 for exposing only alignment mark pattern 600e. Using the photomask 600, pattern images of alignment marks 700A-700E for measuring errors are exposed onto the design positions of alignment marks 600A-600E, by the position control of the stage having semiconductor wafer 400 placed thereon.

Referring to FIG. 29, after development of the resist film, the first layer is patterned using the resist film as a mask for forming first alignment marks 600A-600E and alignment marks 700A-700E provided for measuring errors. At this time, if there is no error incurred by the exposure apparatus, alignment marks 700A-700E for measuring errors are formed right on alignment marks 600A-600E.

However, errors such as lens distortion involved in the exposure apparatus are sensitive to the usage environment including temperature, humidity and the like and change with the environment. Therefore, it has been very difficult to control those errors involved in the exposure apparatus.

Accordingly, in the semiconductor device in which layers are stacked, it has been difficult to overlay respective layers with high accuracy.

SUMMARY OF THE INVENTION

The present invention is directed to a method of forming patterns of a semiconductor device of a multilayer structure, and an object is to provide a method of forming patterns of a multilayer type semiconductor device, which includes a step of measuring an error of a preceding process involved in an exposure apparatus.

A method of forming patterns of a multilayer type semiconductor device of the present invention includes in one aspect the following steps.

A first layer is formed on a semiconductor substrate. A first resist film is formed on the first layer.

An image of a predetermined reference mark is exposed at a predetermined position on the surface of the first resist film by positioning of a stage having the semiconductor substrate placed thereon. An image of a first pattern including a first alignment mark pattern corresponding to the reference mark is exposed onto the surface of the first resist film by using a first exposure apparatus.

The first resist film is then developed. Using the developed first resist film as a mask, the first layer is patterned.

Then, a second layer is formed on the patterned first layer. A second resist film is formed on the second layer.

A position of the first alignment mark formed by patterning of the first layer is measured by a second exposure apparatus, and then the semiconductor substrate is located at a predetermined position of an optical system of the second exposure apparatus.

The position of the reference mark and the position of the first alignment mark, both formed by patterning of the first layer, are compared with each other so as to measure a first error of the first exposure apparatus.

After correcting an image of a second pattern based on the first error, the second pattern image including a second alignment mark pattern corresponding to the reference mark is exposed on the surface of the second resist film using a second exposure apparatus. Then, the second resist film is developed. Using the developed second resist film as a mask, the second layer is patterned.

A third layer is formed on the pattern second layer. A third resist film is formed on the third layer.

After that, a position of the second alignment mark formed by patterning of the second layer is measured by a third exposure apparatus, and the semiconductor substrate is positioned at a predetermined position of the optical system of the third exposure apparatus. Positions of the reference mark and the second alignment mark are compared with each other so as to measure a second error of the second exposure apparatus.

An image of a third pattern including a third alignment mark pattern corresponding to the reference mark is exposed onto the surface of the third resist film by the third exposure apparatus after correction is carried out based on the second error.

Using the developed third resist film as a mask, the third layer is patterned.

According to the method of forming patterns of the multilayer type semiconductor device, even in forming patterns of the semiconductor device made of multiple layers, the error involved in the exposure apparatus incurred during formation of each layer can be measured by comparing the position of the alignment mark formed simultaneously with the pattern of the layer with the position of the reference mark.

Thus, exposure of the upper layers can be carried out with errors of the exposure apparatus included in the lower layers recognized accurately, resulting in improvement of the reliability in performance of a multilayer type semiconductor device formed by stacking a plurality of layers.

In order to achieve the above object, the method of forming patterns of the multilayer type semiconductor device of the present invention is in another aspect a method of forming patterns of the multilayer type semiconductor device having a plurality of chip regions arranged in a matrix on the semiconductor wafer, and the method includes the following steps.

A first layer is formed on the semiconductor wafer. A first resist film is formed on the second layer.

An image of a predetermined reference mark is exposed at a predetermined position in each chip region by positioning of a stage having the semiconductor wafer placed thereon. After that, an image of a first pattern including a first alignment mark pattern corresponding to the reference mark is exposed onto each chip region using a first exposure apparatus.

The first resist film is developed. Using the developed first resist film as a mask, the first layer is patterned.

A second layer is formed on the patterned first layer. A second resist film is formed on the second layer.

A position of the first alignment mark of each chip region formed by patterning of the first layer is measured by a second exposure apparatus, and the semiconductor wafer is positioned at a predetermined position of the optical system of the second exposure apparatus.

The position of the reference mark in each chip region and the position of the first alignment mark in each chip region, both formed by patterning of the first layer, are compared with each other so as to measure a first error in each chip region of the first exposure apparatus.

After correcting an image of a second pattern based on the first error of each chip region, the second pattern image including a second alignment mark pattern corresponding to the reference mark is exposed on the surface of the second resist film using a second exposure apparatus.

The second resist film is developed. Using the developed second resist film as a mask, the second layer is patterned.

A third layer is formed on the patterned second layer. Then, a third resist film is formed on the third layer.

A position of the second alignment mark of each chip region formed by patterning of the second layer is measured by a third exposure apparatus and a semiconductor wafer is positioned at a predetermined position of the optical system of the third exposure apparatus.

Positions of the reference mark and the second alignment mark of each chip region are compared with each other so as to measure a second error in each chip region of the second exposure apparatus.

An image of a third pattern including a third alignment mark pattern corresponding to the reference mark is exposed onto the surface of the third resist film by the third exposure apparatus after correction is carried out based on the second error of each chip region.

Then, the third resist film is developed. Using the developed third resist film as a mask, the third layer is patterned.

According to the method of forming patterns of the multilayer type semiconductor device, even in forming patterns of each chip region of the semiconductor device made by multiple layers, the error involved in the exposure apparatus used in forming each layer can be measured for each chip region by comparing the position of the alignment mark formed simultaneously with the pattern of the layer with the position of the reference mark.

This allows correction of the error for every chip region so as to form the semiconductor device of a high quality.

In order to achieve the above object, the method of forming patterns of the multilayer type semiconductor device of the present invention in still another aspect is a method of forming patterns of the multilayer type semiconductor device having a plurality of chip regions arranged in a matrix on the semiconductor wafer, and the method includes the following steps.

A first layer is formed on the semiconductor wafer. A first resist film is formed on the first layer.

An image of a predetermined reference mark is exposed at a predetermined position in a predetermined chip region selected from the plurality of chip regions by positioning of a stage having the semiconductor wafer placed thereon. An image of a first pattern including a first alignment mark pattern corresponding to the reference mark is exposed onto every chip region using a first exposure apparatus.

The first resist film is developed. Using the developed first resist film as a mask, the first layer is patterned.

A second layer is formed on the patterned first layer. A second resist film is formed on the second layer.

A position of the first alignment mark in the chip region of a predetermined position formed by patterning of the first layer is measured by a second exposure apparatus and the semiconductor wafer is positioned at a predetermined position of the optical system of the second exposure apparatus.

The position of the reference mark in the selected chip region and the position of the first alignment mark, both formed by patterning of the first layer, are compared with each other so as to measure a first error of the first exposure apparatus.

After correcting an image of a second pattern based on the first error, the second pattern image including a second alignment mark pattern corresponding to the reference mark is exposed on the surface of the second resist film using a second exposure apparatus.

The second resist film is developed. Using the developed second resist film as a mask, the second layer is patterned.

A third layer is formed on the patterned second layer. A third resist film is formed on the third layer.

A position of the second alignment mark in the chip region of a predetermined position formed by patterning of the second layer is measured by a third exposure apparatus, and the semiconductor wafer is positioned at a predetermined position of the optical system of the third exposure apparatus.

Then, positions of the reference mark in the selected chip region and the second alignment mark are compared with each other so as to measure a second error of the second exposure apparatus. After that, an image of a third pattern including a third alignment mark corresponding to the reference mark is exposed onto the surface of the third resist film by the third exposure apparatus after correction is carried out based on the second error.

The third resist film is developed. Using the developed third resist film as a mask, the third layer is patterned.

According to the method of forming patterns of the multilayer type semiconductor device, the measurement of the first error in the selected chip region allows an approximate measurement of an error of the overall semiconductor wafer. This eliminates the need for forming the reference marks in all the chip regions, so that the process of forming reference marks can be shortened.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a plan view showing the first photomask used in the embodiment covered by a blind.

FIGS. 6–9 show chip regions according to first through fourth steps of a pattern forming method of the present invention, in which (a) is a plan view and (b) is a cross sectional view thereof.

DESCRIPTION OF THE PREFERRED EMBODIMENTS

An embodiment of a method of forming a pattern of a multilayer type semiconductor device according to the present invention will be described with reference to the drawings.

Figure 1:
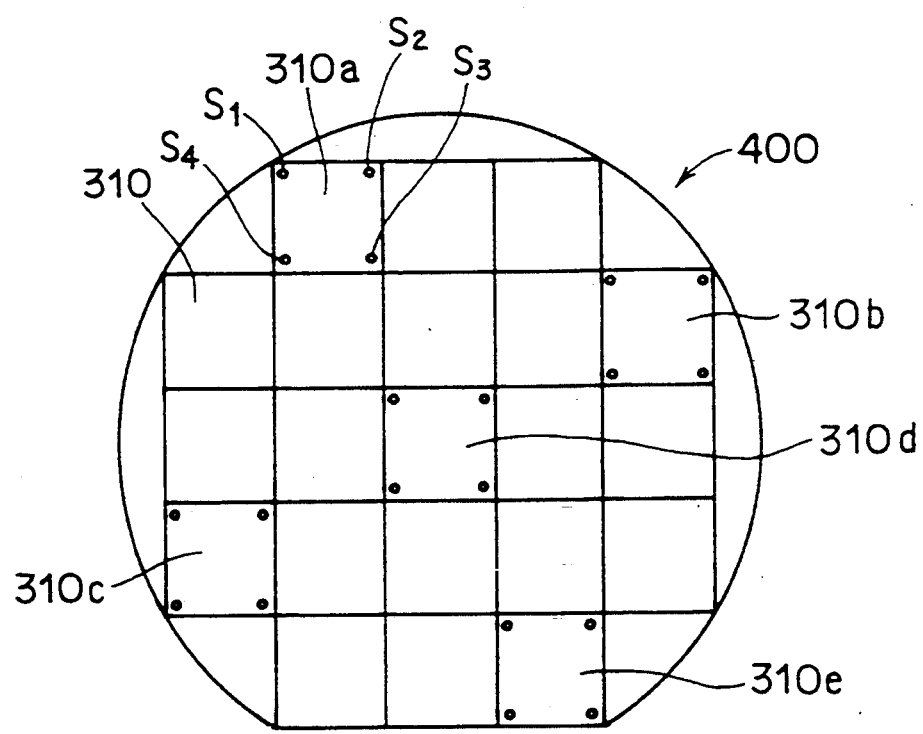
FIG. 1 is a plan view showing a structure of chip regions formed on a semiconductor wafer.

First, referring to FIG. 1, a plurality of chip regions 310 are arranged in a matrix on a semiconductor wafer 400. Reference marks $S_1$, $S_2$, $S_3$, $S_4$ and $S_5$ are formed on each of predetermined selected chip regions 310a, 310b, 310c, 310d, and 310e, respectively.

The following description will be directed to a method of forming patterns of the multilayer type semiconductor device formed by stacking two layers in the case when chip regions with reference marks $S_1$–$S_5$ and chip regions without those marks are mixed. The purpose of the reference marks and the reason of mixing regions with or without those reference marks will be apparent in the following description.

Figure 2:
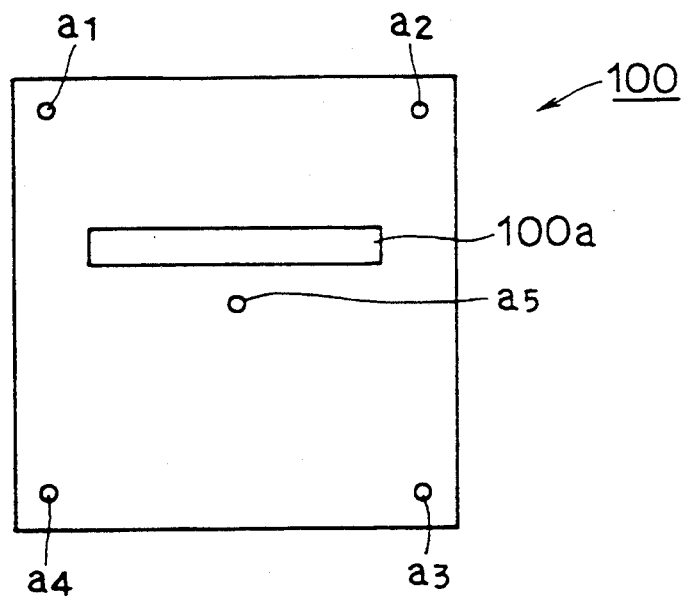
FIG. 2 is a plan view of a first photomask used in an embodiment of the present invention.
Figure 3:
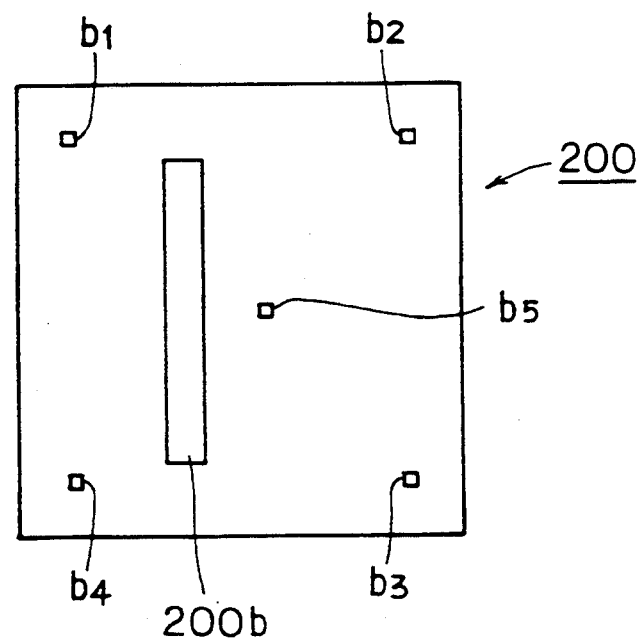
FIG. 3 is a plan view of a second photomask used in an embodiment of the present invention.
Figure 4:
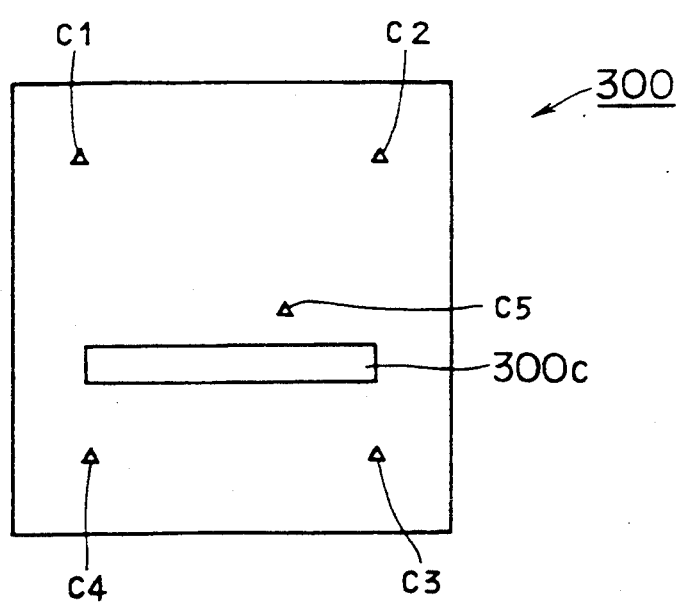
FIG. 4 is a plan view of a third photomask used in an embodiment of the present invention.

Referring to FIGS. 2, 3, and 4 the form of first and second photomasks used in the present embodiment will be described.

Referring to FIG. 2, a first photomask 100 includes a first pattern 100a formed at a predetermined position, together with first alignment mark patterns $a_1$–$a_5$. It is noted that in the present embodiment an exposure light transmits through regions having those patterns whereby a positive type resist film is exposed.

Referring to FIG. 3, a second photomask 200 includes a second pattern 200b formed at a predetermined position, second alignment mark patterns $b_1$-$b_5$ being formed at position coordinates different from those of first alignment mark patterns $a_1$–$a_5$. For second photomask 200, it is noted that the exposure light transmits through each pattern region whereby the positive type resist film is exposed as with first photomask 100.

With reference to FIG. 4, a third photomask 300 includes a third pattern 300c formed at a predetermined position, and third alignment mark patterns $c_1$–$c_5$ formed at such position coordinates which are different from those of either first alignment mark patterns $a_1$–$a_5$ or second alignment mark patterns $b_1$–$b_5$. An exposure light transmits through respective pattern regions of photomask 300 to expose a positive type resist film as in first and second photomasks 100, 200.

Figure 10:
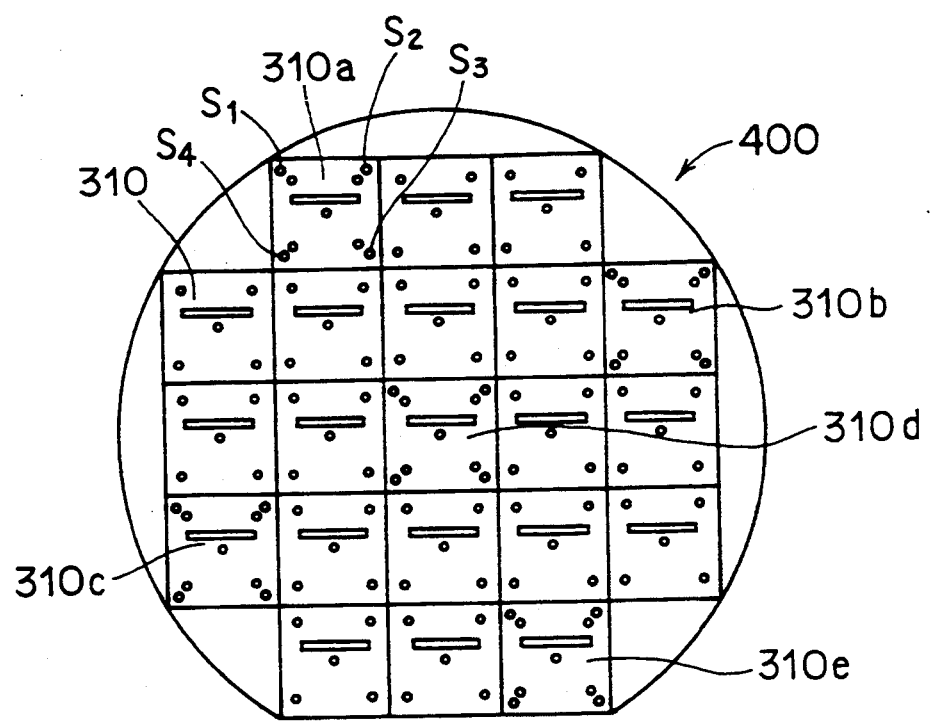
FIG. 10 is a plan view of a semiconductor wafer wherein a first pattern is formed.
Figure 17:
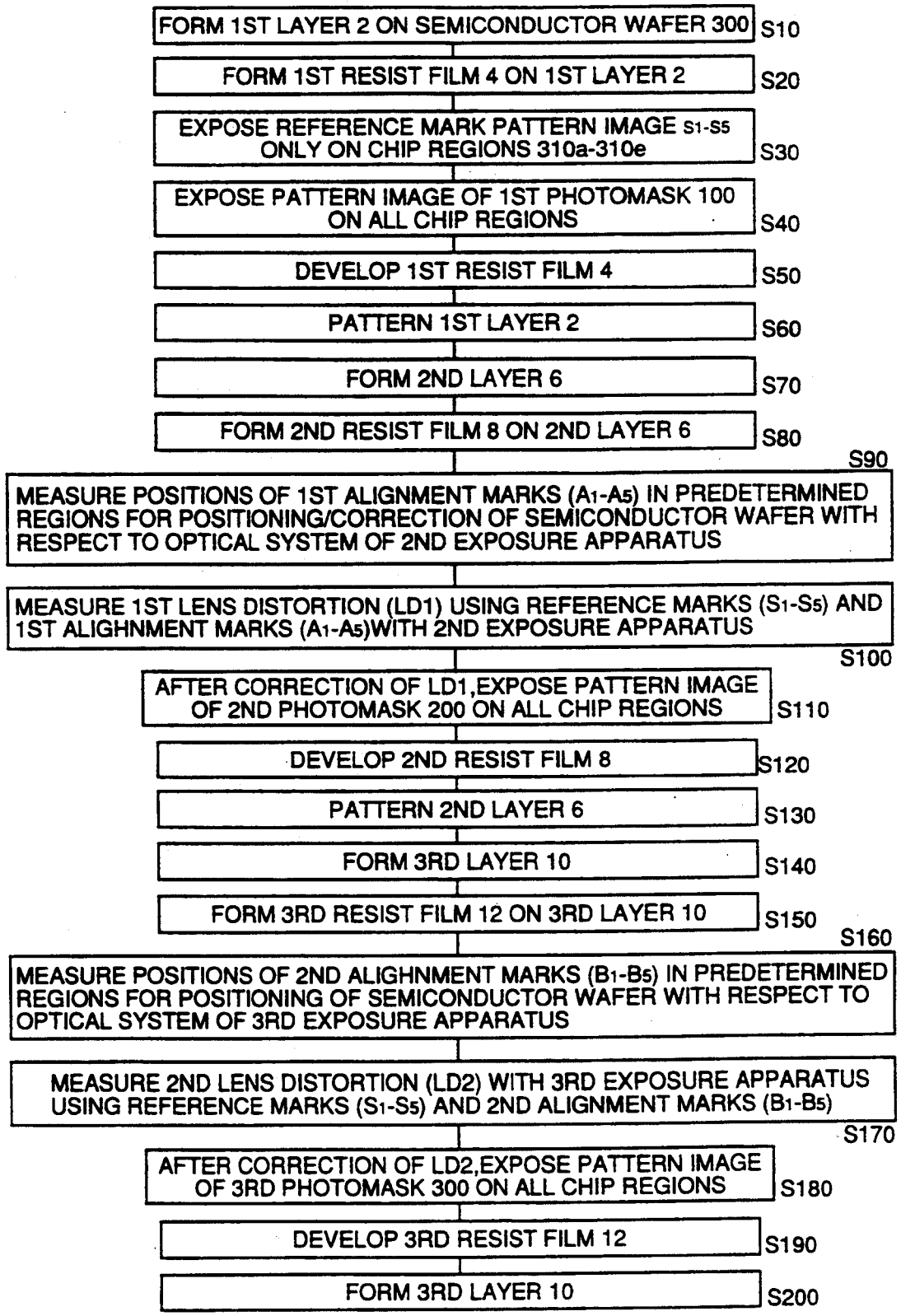
FIG. 17 is a flow chart showing the steps of the pattern forming method of the present invention.

Now, description will be given for the steps until the first pattern is formed in the chip region using a first exposure apparatus provided with first photomask 100, with reference to FIGS. 5, 10 and 17. FIG. 17 shows a flow chart of the manufacturing process. It should be also noted that although only one chip region is shown for convenience in the drawings, chip regions 310 are formed in a matrix on semiconductor wafer 400 by the step and repeat method described above for exposure onto semiconductor wafer 400.

First referring to FIG. 5, first photomask 100 has been covered by a blind 500 such that any one of alignment mark patterns, for example, only an alignment mark pattern $a_4$ is exposed.

Referring to FIG. 6, a first layer 2 is formed on semiconductor wafer 400 (step 10 (referred to as S10 hereinafter) in FIG. 17). Then, a first resist film 4 is formed on first layer 2 (S20 in FIG. 17).

Figures 7A, 7B:
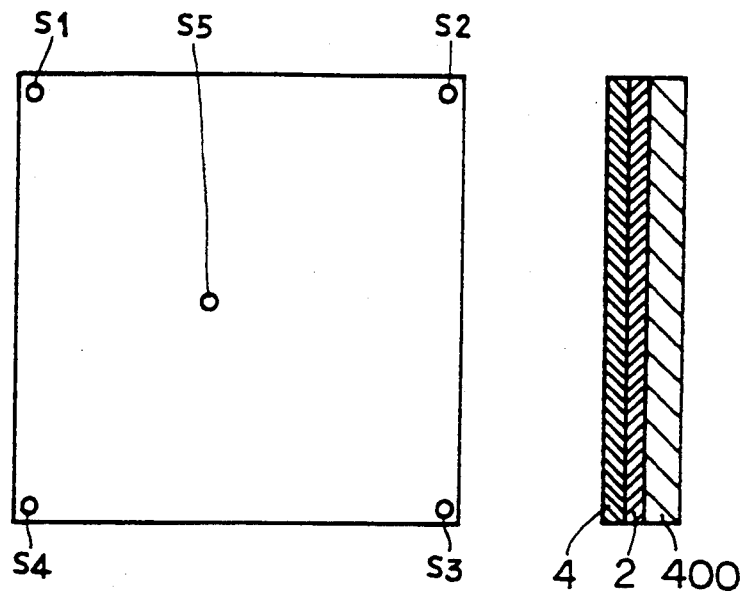
Figures 8A, 8B:
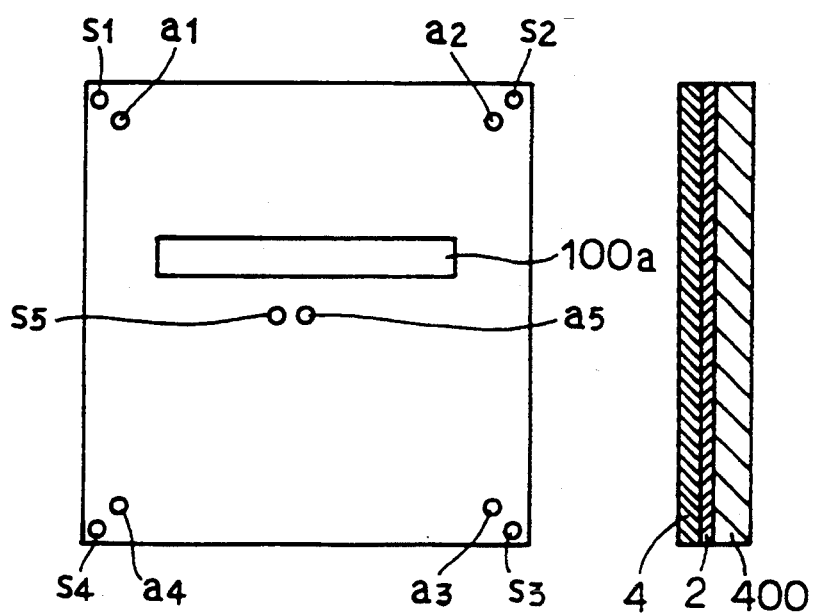
Figures 9A, 9B:
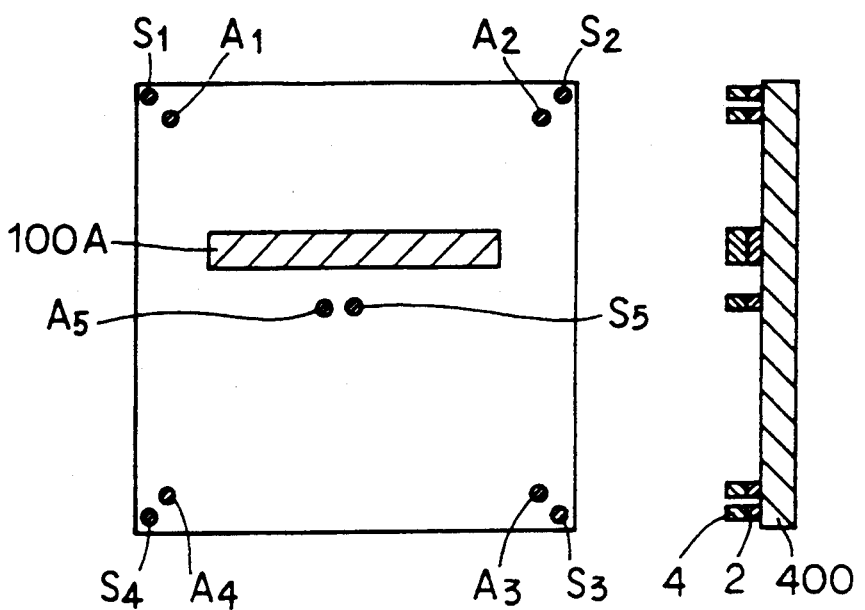

Referring to FIGS. 7-9, the manufacturing steps of the chip region wherein reference marks are formed will be described. The process of the chip region without reference marks is the same as in the region with reference marks except for a step of forming such reference marks. Referring to FIG. 7, using only one alignment mark pattern a4 of first photomask 100, images of reference mark patterns ($a_1$-$a_5$) are exposed at predetermined positions on a semiconductor chip region by positioning of a first exposure apparatus having semiconductor wafer 400 placed thereon (S30 in FIG. 17). At this time, it is desired to provide position coordinates of images of reference mark patterns ($s_1$-$s_5$) different from those of alignment mark patterns ($a_1$-$a_5$) formed on first photomask 100.

Referring to FIG. 8, blind 500 covering first photomask 100 is removed and an image of first pattern 100a of first photomask 100 and images of first alignment marks $s_1$-$s_5$ are exposed onto the surface of first resist film 4 using the first exposure apparatus (S40 in FIG. 17).

Referring to FIG. 9, first resist film 4 is developed (S50 in FIG. 17). Using the developed first resist film 4 as a mask, first layer 2 is patterned (S60 in FIG. 17).

Thus, a first pattern 100A, first alignment marks $A_1$-$A_5$, and reference alignment marks $S_1$-$S_5$ are formed on the selected chip region. Patterns are thus formed on semiconductor wafer 400 as shown in FIG. 10.

Figures 11A, 11B:
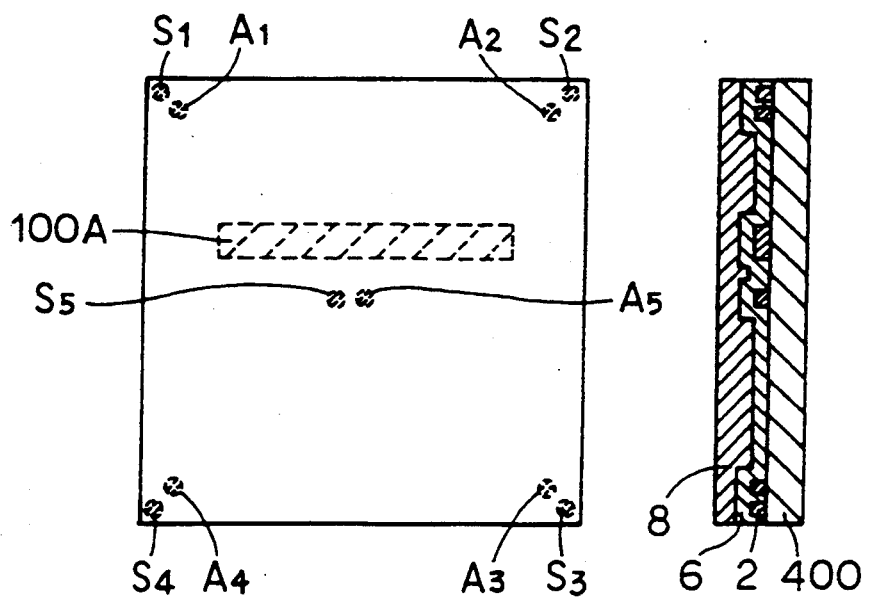
FIGS. 11–16 show chip regions according to fifth through tenth steps of the pattern forming method of the present invention, in which (a) are plan views and (b) are cross sectional views thereof.

With reference to FIG. 11, a second layer 6 is formed on semiconductor wafer 400 (S70 in FIG. 17). A second resist film 8 is then formed on second layer 6 (S80 in FIG. 17).

Semiconductor wafer 400 wherein second layer 6 and second resist film 8 are formed is placed on a second exposure apparatus with a second photomask 200 mounted thereon. Using the second exposure apparatus, a plurality of points of first alignment marks $A_1$-$A_5$ provided on predetermined chip regions are measured for correcting positioning of semiconductor wafer 400 with respect to the optical system of the second exposure apparatus (S90 in FIG. 17).

Next, using reference marks $S_1$-$S_5$ and first alignment marks $A_1$-$A_5$, an error involved in the first exposure apparatus, so called a first lens distortion (LD1) is measured (S100 in FIG. 17).

Detection of the positions of reference marks $S_1$-$S_5$ and first alignment marks $A_1$-$A_5$ is carried out by the similar method described in the conventional position detecting method, and LD1 is calculated as below.

Figure 18:
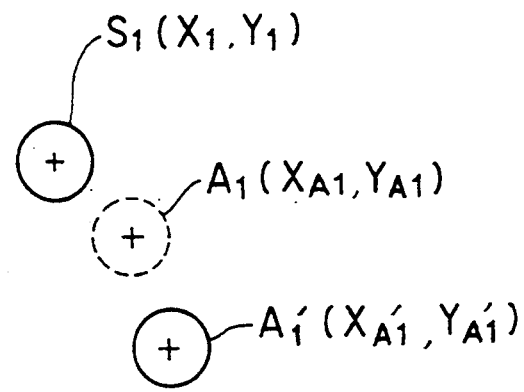
FIG. 18 is a schematic view showing a method of measuring an error in the pattern forming method of the present invention.

For example, referring to FIG. 18, if the position difference of design coordinates between reference mark $S_1(X_1, Y_1)$ and first alignment mark $A_1(X_{A1}, Y_{A1})$ is $\Delta X_1 = X_1 - X_{A1}$
$\Delta Y_1 = Y_1 - Y_{A1}$.

and assuming the position of first alignment mark $A_1$ after patterning is $(X_{A1}, Y_{A1})$, the difference from reference mark $S_1(X_1, Y_1)$ is $\Delta X_1' = X_1 - X_{A1}'$
$\Delta Y_1' = Y_1 - Y_{A1}'$.

Thus, a first lens distortion error $\alpha_1$ will be $\alpha_1 = (\Delta x_1, \Delta y_1)$ because $\Delta x_1' = \Delta X_1' - \Delta X_1$ $\Delta y_1' = \Delta Y_1' = \Delta Y_1$.

In the same manner, respective errors $\alpha_2$, $\alpha_3$, and $\alpha_4$ between each of reference marks $S_2$-$S_3$ and each of first alignment marks $A_2$-$A_5$ will be calculated as follows:

$\alpha_2 = (\Delta x_2, \Delta y_2)$
$\alpha_3 = (\Delta x_3, \Delta y_3)$
$\alpha_4 = (\Delta x_4, \Delta y_4)$
$\alpha_5 = (\Delta x_5, \Delta y_5)$ The first lens distortion can be thus measured.

As for a correcting method of the thus measured first lens distortion, the correction of the error can be carried out by the X-Y stage so long as the measured error is corrected merely by translation in X direction or Y direction.

In the event that the distortion of the pattern image is expanded or reduced in the X or Y direction, the error due to the lens distortion can be corrected by the methods such as correcting the magnification by controlling the internal pressure of the chamber of the lens or deforming the photomask as disclosed in Japanese Patent Laying-Open No. 2-310912.

Figures 12A, 12B:
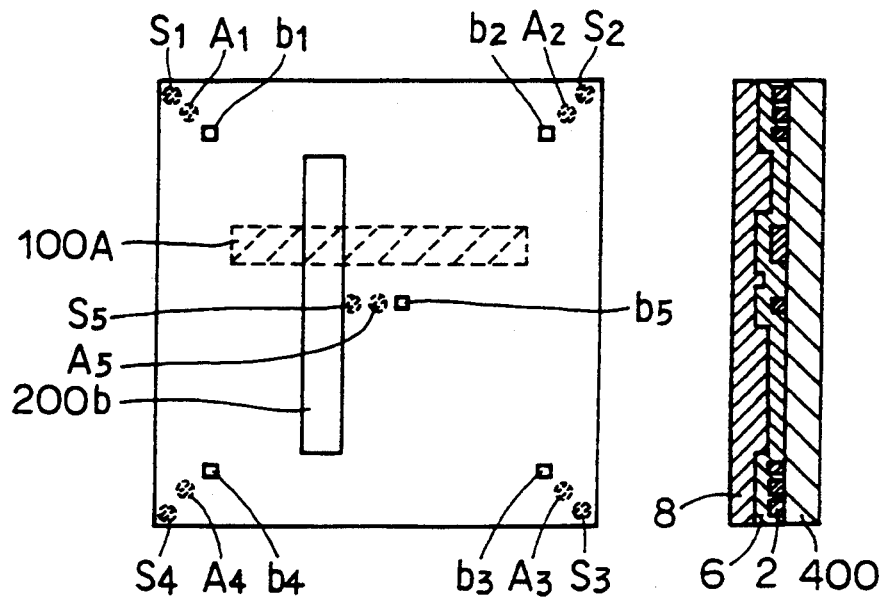

With reference to FIG. 12, the first lens distortion (LD1) is corrected in the second exposure apparatus, and the image of the pattern of second photomask 200 is exposed onto every chip region on the surface of second resist film 8 (S110 in FIG. 17).

Figures 13A, 13B:
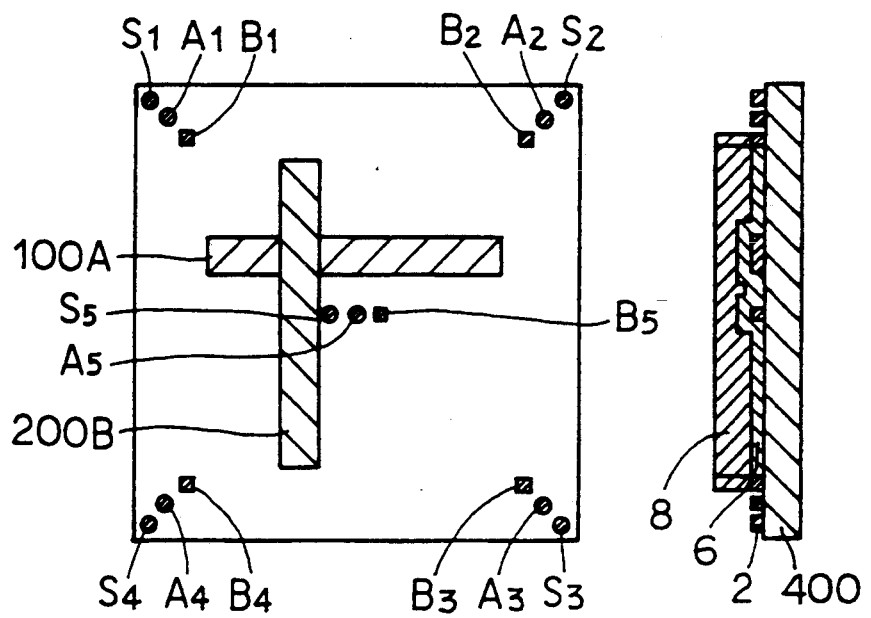

Referring to FIG. 13, using second resist film 8 as a mask, second layer 6 is patterned (S130 in FIG. 17). The second pattern is thus formed on the first pattern.

Figures 14A, 14B:
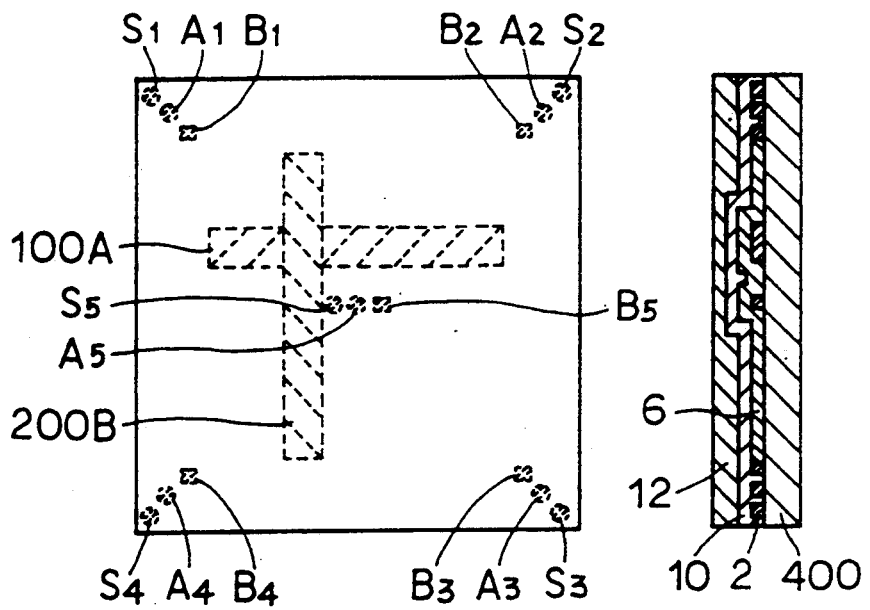

Referring next to FIG. 14, a third layer 10 is formed on semiconductor wafer 400 (S140 in FIG. 17). A second resist film 12 is formed on third layer 10 (S150 in FIG. 17).

Then, the semiconductor wafer wherein third layer 10 and third resist film 12 are formed is placed on a third exposure apparatus with third photomask 300 mounted thereon. Using the third exposure apparatus, a plurality of points of second alignment marks $B_1$-$B_5$ on predetermined chip regions are measured for correcting positioning of semiconductor wafer 400 with respect to the optical system of the third exposure apparatus (S160 in FIG. 17).

Using reference marks $S_1$-$S_5$ and second alignment marks $B_1$-$B_5$, an error involved in the second exposure apparatus, that is, a second lens distortion (LD2) is measured (S170 in FIG. 17).

The second lens distortion (LD2) can be calculated in the same method as the first lens distortion (LD1).

Figures 15A, 15B:
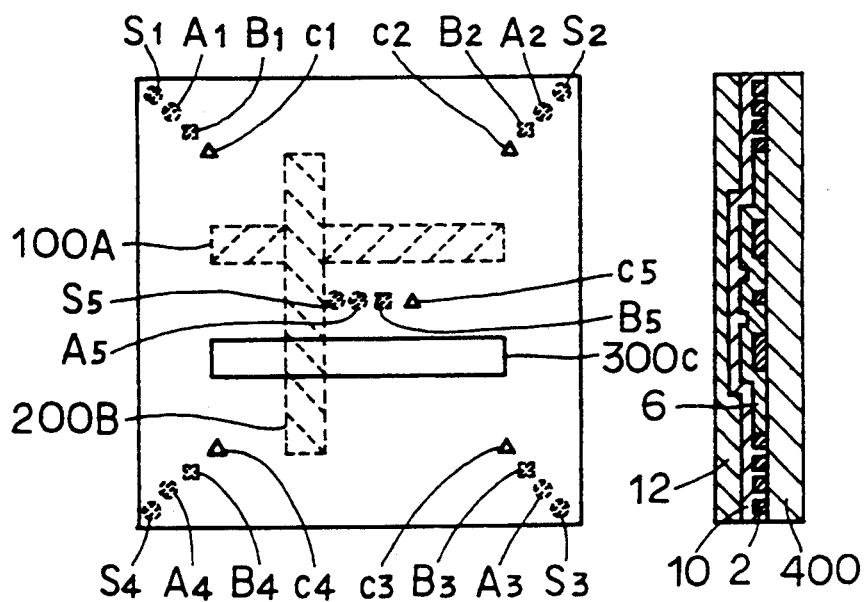

With reference to FIG. 15, after correction of the second lens distortion (LD2) in the third exposure apparatus, the image of the pattern of third photomask 300 is exposed onto every chip region on the surface of third resist film 12 (S180 in FIG. 17).

Figures 16A, 16B:
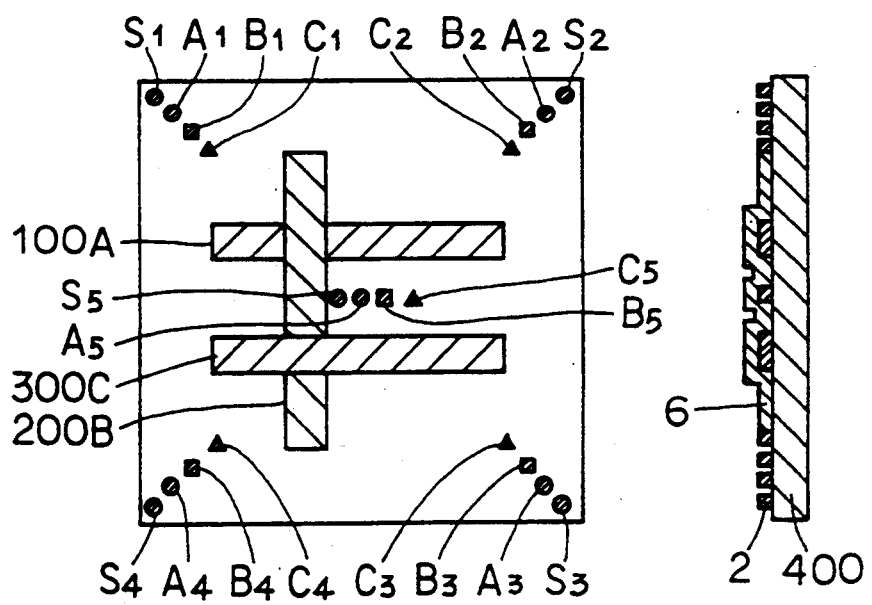

With reference to FIG. 16, third resist film 12 is developed (S190 in FIG. 17). Using the developed third resist film 12 as a mask, third layer 10 is patterned (S200 in FIG. 17). The third pattern is thus formed on the first and second patterns.

Also in the present embodiment, the description has been given for the case when regions with and without reference marks are mixed, which is intended to reduce the number of steps necessary for forming reference marks as much as possible by forming reference marks only on the selected chip regions, whereby the manufacturing process of the semiconductor device can be shortened and the first lens distortion of the overall semiconductor wafer can be obtained based on the lens distortion measured in the regions with reference marks.

Figure 19:
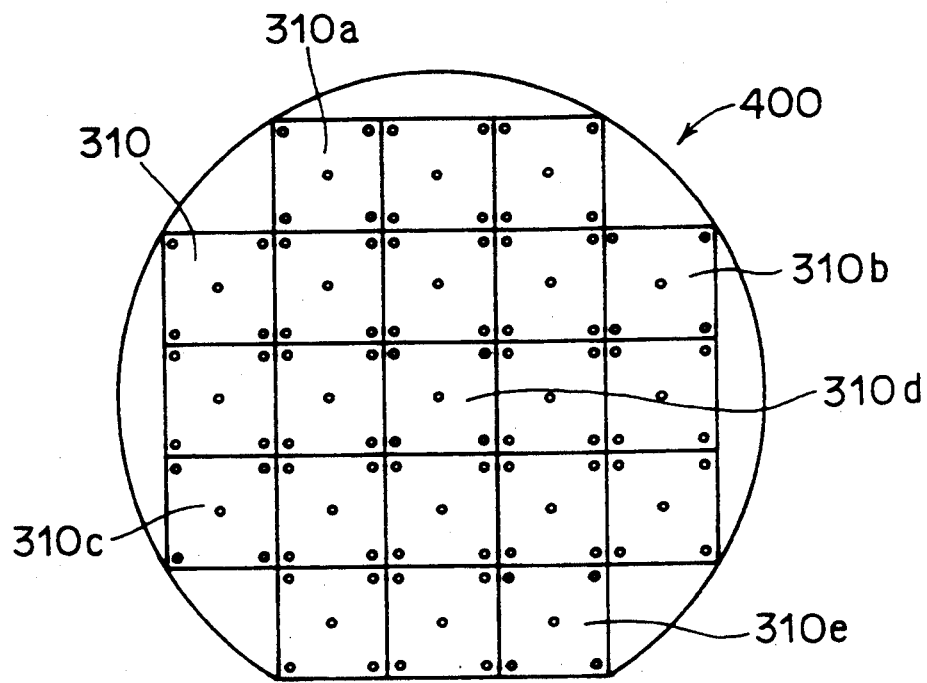
FIG. 19 is a plan view showing reference marks being formed on all the chip regions.
Figure 20:
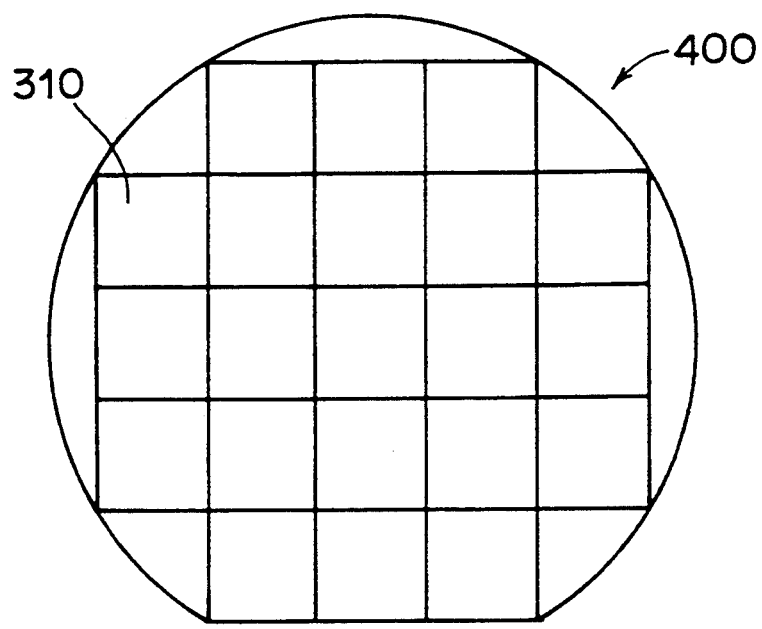
FIG. 20 is a plan view showing pattern forming regions on the semiconductor wafer in the conventional art.
Figure 21:
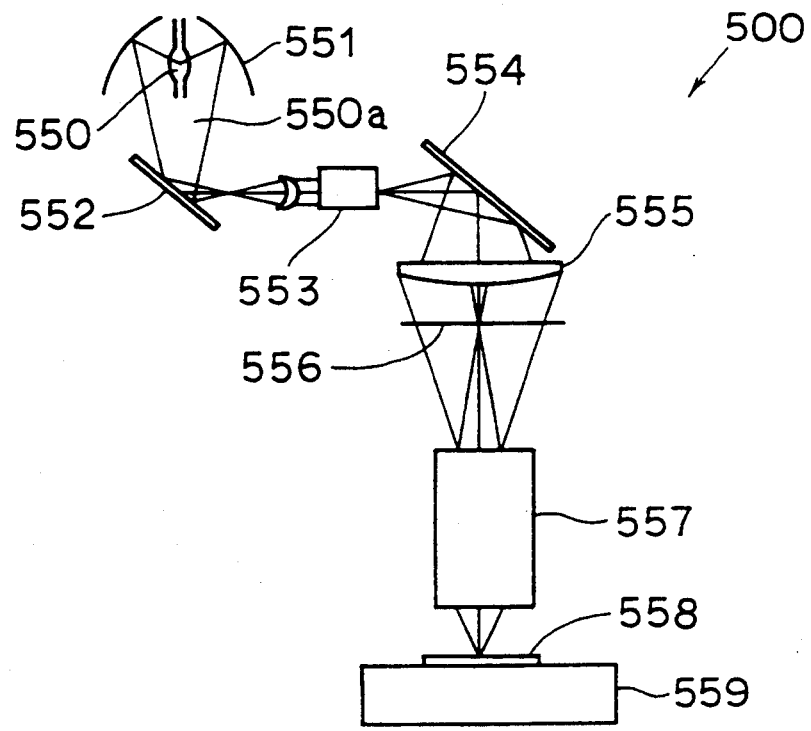
FIG. 21 is a schematic diagram showing an overall structure of a reduction projection aligner.
Figure 22:
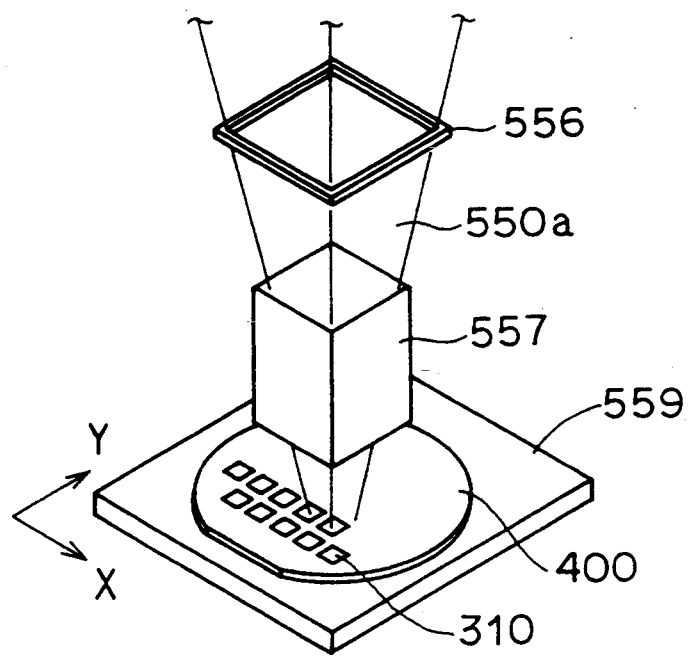
FIG. 22 is a concept diagram showing chip regions being formed in a matrix on the semiconductor wafer.
Figure 23:
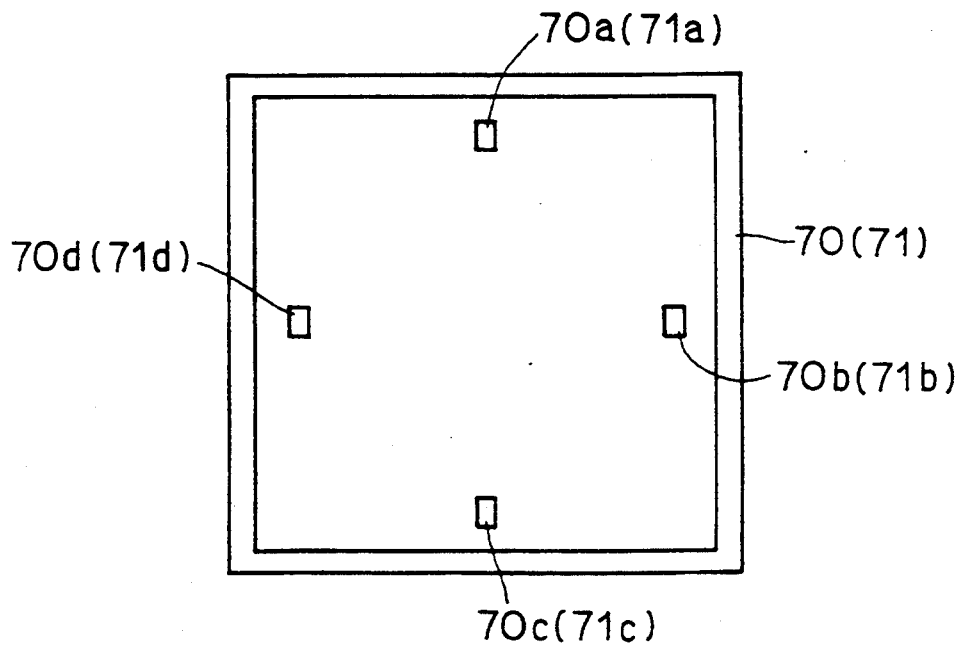
FIG. 23 is a plan view showing alignment mark patterns formed on a conventional photomask.
Figure 24:
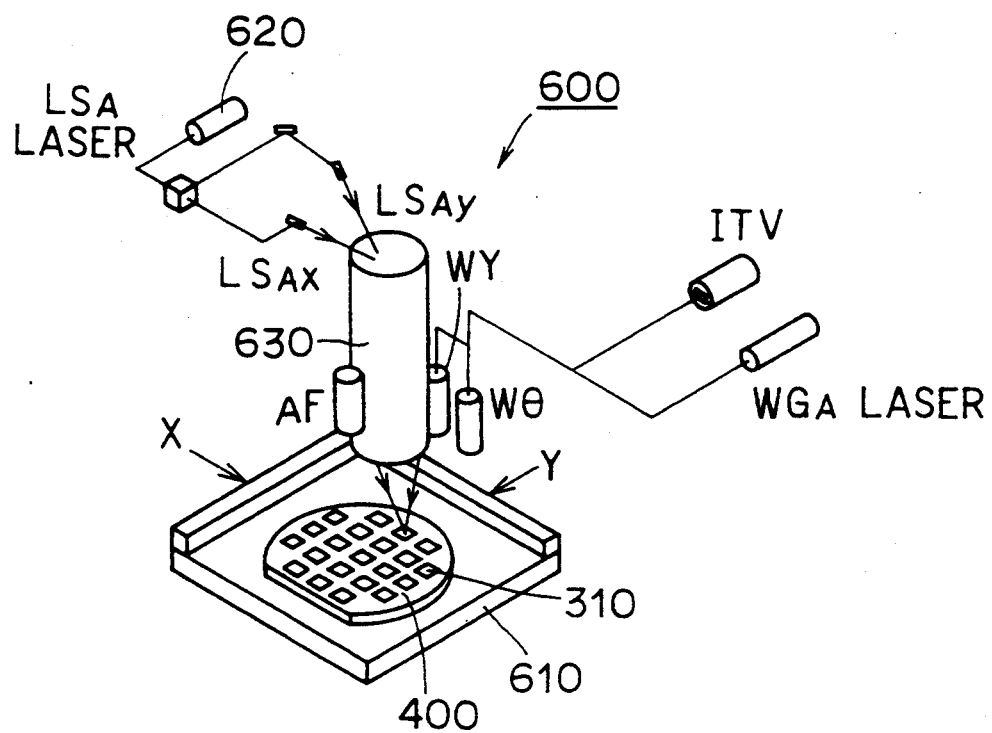
FIG. 24 is a schematic diagram showing a method of detecting alignment marks.
Figure 25:
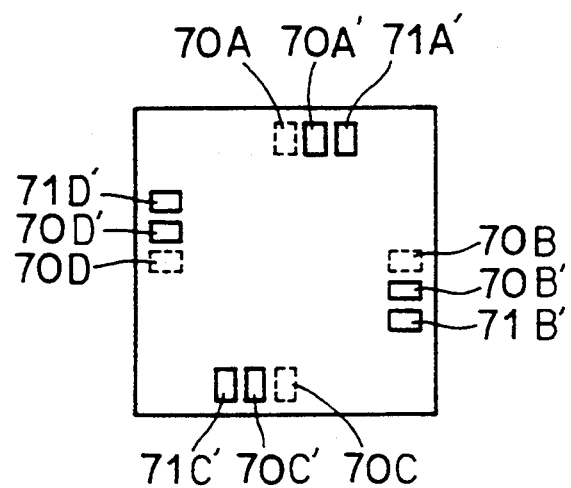
FIG. 25 is a schematic diagram showing a problem in a conventional exposure method.
Figure 26:
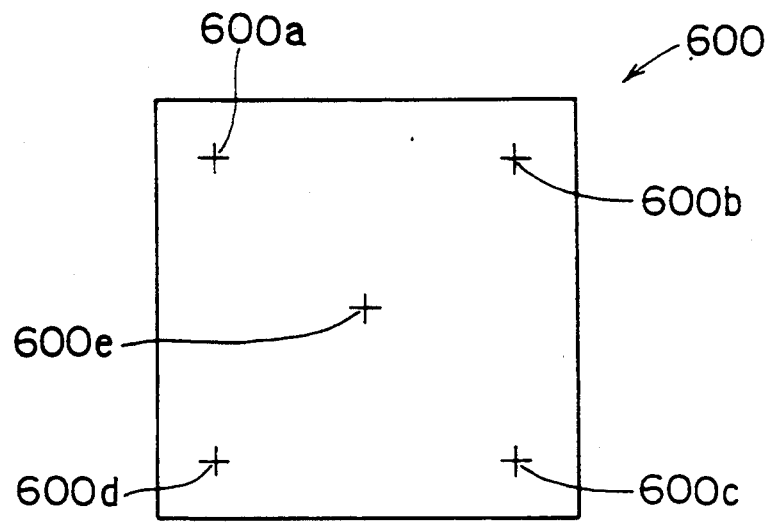
FIG. 26 is a plan view showing a structure of the conventional photomask.
Figure 27:
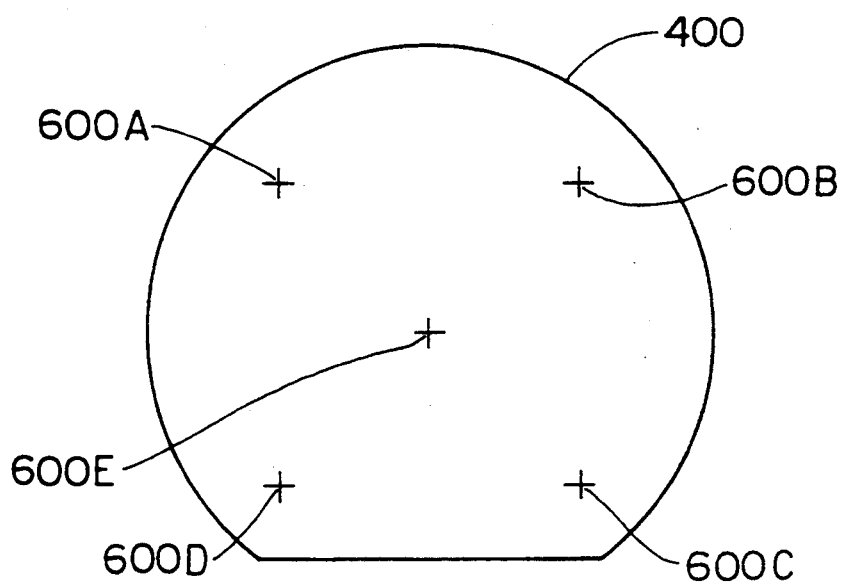
FIG. 27 is a plan view showing alignment marks formed on a semiconductor wafer in the conventional art.
Figure 28:
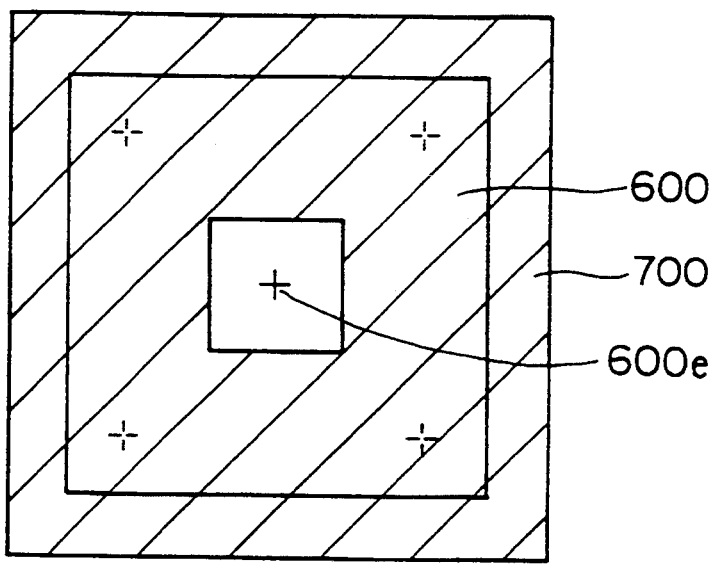
FIG. 28 is a plan view showing the photomask used in the conventional art being covered by a blind.
Figure 29:
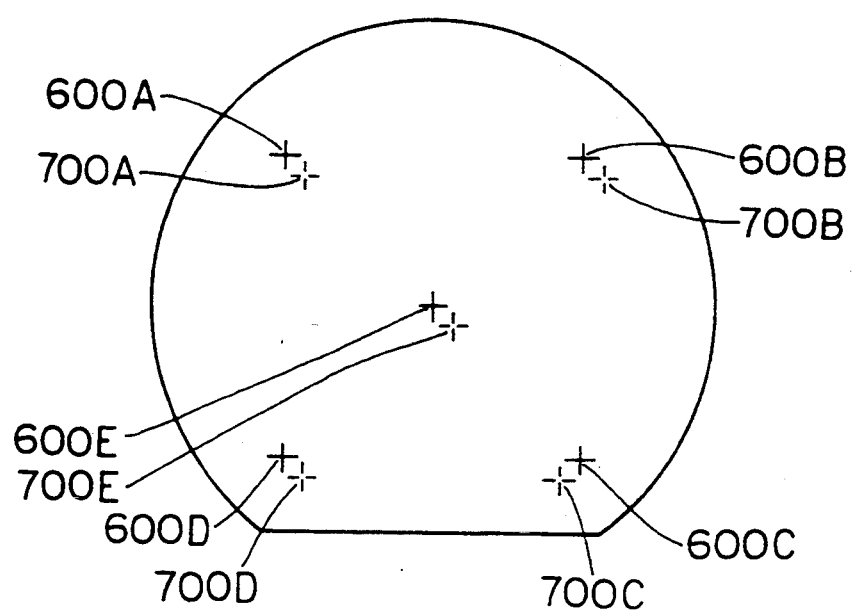
FIG. 29 is a plan view showing alignment marks formed on the semiconductor wafer with respect to alignment marks for measuring errors in the conventional art.

In other words, ignoring the increase of the number of manufacturing steps of the semiconductor device, reference marks can be provided in all the chip regions 310 as shown in FIG. 19 such that the first lens distortion is measured in all the chip regions, whereby the lens distortion can be measured for each chip region.

As described above, in this embodiment reference marks are formed in predetermined chip regions on the semiconductor substrate and first alignment marks are formed simultaneously with formation of the pattern of the first layer. Thus, the first lens distortion involved in the first exposure apparatus can be measured according to the position relationship between the first alignment marks and the reference marks.

When forming the second layer, exposure is carried out by the second exposure apparatus after correction of the first lens distortion error, and the second alignment marks are formed simultaneously with formation of the pattern of the second layer. Thus, the second lens distortion involved in the second exposure apparatus can be measured according to the position relationship between the second alignment marks and the reference marks.

Thus, marks used as reference for measuring the lens distortion are formed on the substrate in advance, and alignment marks for measuring the lens distortion included in respective layers are formed at the same time as forming patterns of respective layers, so that respective layers can be overlaid with each other accurately.

As described above, in one aspect of a method of forming patterns of a multilayer type semiconductor device according to the present invention, reference marks are formed in advance on a semiconductor wafer by positioning of a stage and then positions of those reference marks are compared with positions of first alignment marks for measuring an error of a first exposure apparatus. Further, an error of a second exposure apparatus is measured by measuring positions of the reference marks and second alignment marks.

Thus, even in pattern formation of a semiconductor device made of a plurality of layers, the error involved in the exposure apparatus used in forming the layer can be measured by comparing positions of alignment marks formed simultaneously with the pattern of each layer and positions of the reference marks.

This eliminates the conventional step of forming marks for measuring errors on each layer. Consequently, the number of manufacturing steps of the semiconductor device made of multiple layers can be reduced and the manufacturing cost thereof can also be reduced.

Thus, exposure of the patterns of the upper layers can be carried out with the error of the exposure apparatus included in the lower layers recognized accurately, resulting in improvement of the reliability in performance of the multilayer type semiconductor device which is formed by a plurality of stacked layers.

In another aspect of the method of forming patterns of the multilayer type semiconductor device according to the present invention, reference marks are formed in advance by positioning of the stage on respective chip regions arranged in a matrix on the semiconductor wafer, and positions of those reference marks are compared with positions of first alignment marks formed on each chip region for measuring the error of the first exposure apparatus included in each chip region. Also, the error of the second exposure apparatus in each chip region can be measured by comparing positions of the reference marks and the second alignment marks.

Thus, even in formation of patterns of each chip region of the semiconductor device made of multiple layers, positions of alignment marks formed simultaneously with the pattern of each layer are compared with positions of the reference marks so that the error involved in the exposure apparatus used in forming the layer can be measured for each chip region. Further, the error of the second exposure apparatus in the selected chip region can be made by comparing positions of the reference mark and the second alignment mark formed in the selected region.

The error can be corrected for each chip region so that the semiconductor device of a high quality can be obtained.

In still another aspect of the method of forming patterns of the multilayer type semiconductor device according to the present invention, reference marks are formed in advance on the chip regions selected from the plurality of chip regions arranged in the matrix on the semiconductor wafer by positioning of the stage, positions of those reference marks are compared with positions of first alignment marks formed in those selected chip regions for measuring the error of the first exposure apparatus for the selected chip regions. Also, the error of the second exposure apparatus in the selected chip regions can be measured by comparing the positions of the reference marks with the positions of the second alignment marks formed in the selected regions.

Thus, the error of the overall semiconductor wafer can be measured approximately according to the error of the first exposure apparatus measured for the selected chip regions. Consequently, the number of steps necessary for forming reference marks can be reduced because reference marks do not have to be formed on all the chip regions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a pattern of a multilayer type semiconductor device, comprising the steps of:

forming a first layer on a semiconductor substrate;

forming a first resist film on said first layer;

positioning by a stage having said semiconductor substrate placed thereon and exposing onto the surface of said first resist film an image of a predetermined reference mark at a predetermined position;

exposing onto the surface of said first resist film an image of a first pattern including a first alignment mark pattern corresponding to said reference mark with a first exposure apparatus;

developing said first resist film;

patterning said first layer using said developed first resist film as a mask;

forming a second layer on said patterned first layer;

forming a second resist film on said second layer;

measuring with a second exposure apparatus a position of the first alignment mark formed by patterning of said first layer for positioning said semiconductor substrate at a predetermined position of an optical system of said second exposure apparatus;

comparing a position of said reference mark with a position of said first alignment mark, both formed by patterning of said first layer, for measuring a first error of said first exposure apparatus;

correcting an image of a second pattern based on said first error and exposing onto the surface of said second resist film the second pattern image including a second alignment mark pattern corresponding to said reference mark with a second exposure apparatus;

developing said second resist film;

patterning said second layer using said developed second resist film as a mask;

forming a third layer on said patterned second layer;

forming a third resist film on said third layer;

measuring with a third exposure apparatus a position of the second alignment mark formed by patterning of said second layer for positioning said semiconductor substrate at a predetermined position of an optical system of said third exposure apparatus;

comparing a position of said reference mark with a position of said second alignment mark for measuring a second error of said second exposure apparatus;

exposing with a third exposure apparatus onto a surface of said third resist film a third pattern image including a third alignment mark pattern corresponding to said reference mark after carrying out correction based on said second error;

developing said third resist film; and patterning said third layer using said developed third resist film as a mask.

2. A method of forming a pattern of a multilayer type semiconductor device according to claim 1, wherein said step of exposing the image of said reference mark includes the step of exposing vicinities of four corners of said semiconductor substrate.

3. A method of forming a pattern of a multilayer type semiconductor device according to claim 1, wherein said step of exposing the image of said first alignment mark pattern includes the step of exposing vicinity of said reference mar.

4. A method of forming a pattern of a multilayer type semiconductor device according to claim 1, wherein said step of exposing the image of said second alignment mark pattern includes the step of exposing the vicinity of said reference mark at a position different from position coordinates of said first alignment mark.

5. A method of forming a pattern of a multilayer type semiconductor device according to claim 1, wherein said step of exposing the pattern image of said third alignment mark pattern includes the step of exposing a vicinity of said reference mark at a position different from position coordinates of said first and second alignment marks.

6. A method of forming a pattern of a multilayer type semiconductor device according to claim 1, wherein said step of measuring the first error of the first exposure apparatus includes the step of comparing a difference between position coordinates of said reference mark and designed position coordinates of said first alignment mark with a difference between position coordinates of said reference mark and position coordinates of said first alignment mark formed on said first layer.

7. A method of forming a pattern of a multilayer type semiconductor device according to claim 1, wherein said step of measuring the second error of said second exposure apparatus includes the step of comparing a difference between position coordinates of said reference mark and designed position coordinates of said second alignment mark with a difference between position coordinates of said reference mark and position coordinates of said second alignment mark formed on said second layer.

8. A method of forming a pattern of a multilayer type semiconductor device including a plurality of chip regions arranged in a matrix on a semiconductor wafer, comprising the steps of:

forming a first layer on said semiconductor wafer;

forming a first resist film on said first layer;

positioning by a stage having said semiconductor wafer placed thereon and exposing an image of a predetermined reference mark at a predetermined position of each chip region;

exposing an image of a first pattern including a first alignment mark corresponding to said reference mark onto each chip region with a first exposure apparatus;

developing said first resist film;

patterning said first layer using said developed first resist film as a mask;

forming a second layer on said patterned first layer;

forming a second resist film on said second layer;

measuring with a second exposure apparatus a position of the first alignment mark in each chip region formed by patterning of said first layer for positioning said semiconductor wafer at a predetermined position of the optical system of said second exposure apparatus;

comparing a position of the reference mark in each chip region with a position of the first alignment mark in each chip region, both formed by patterning of said first layer, for measuring a first error in each chip region of said first exposure apparatus;

correcting an image of a second pattern based on said first error of each chip region and exposing onto the surface of said second resist film the second pattern image including a second alignment mark corresponding to said reference mark with a second exposure apparatus;

developing said second resist film;

patterning said second layer using said developed second resist film as a mask;

forming a third layer on said patterned second layer;

forming a third resist film on said third layer;

measuring with a third exposure apparatus a position of the second alignment mark in each chip region formed by patterning of said second layer for positioning said semiconductor wafer at a predetermined position of the optical system of said third exposure apparatus;

comparing a position of said reference mark in each chip region with a position of said second alignment mark in each chip region for measuring a second error in each chip region of said second exposure apparatus;

exposing with said third exposure apparatus onto a surface of said third resist film a third pattern image including a third alignment mark corresponding to said reference mark after carrying out correction based on said second error of each chip region;

developing said third resist film; and patterning said third layer using said developed third resist film as a mask.

9. A method of forming a pattern of a multilayer type semiconductor device according to claim 8, wherein said step of exposing the image of said reference mark includes the step of exposing vicinities of four corners of said chip region.

10. A method of forming a pattern of a multilayer type semiconductor device according to claim 8, wherein said step of exposing the image of said first alignment mark pattern includes the step of exposing the vicinity of said reference mark.

11. A method of forming a pattern of a multilayer type semiconductor device according to claim 8, wherein said step of exposing the image of said second alignment mark pattern includes the step of exposing the vicinity of said reference mark at a position different from position coordinates of said first alignment mark.

12. A method of forming a pattern of a multilayer type semiconductor device according to claim 11, wherein said step of exposing the image of said second alignment mark pattern includes the step of exposing the vicinity of said reference mark at a position different from position coordinates of said first alignment mark.

13. A method of forming a pattern of a multilayer type semiconductor device according to claim 11, wherein said step of measuring the first error of said first exposure apparatus includes the step of comparing
 a difference between position coordinates of said reference mark and designed position coordinates of said first alignment mark, with
 a difference between position coordinates of said reference mark and position coordinates of said first alignment mark formed on said first layer.

14. A method of forming a pattern of a multilayer type semiconductor device according to claim 8, wherein said step of exposing the pattern image of the third alignment mark pattern includes the step of exposing a vicinity of said reference mark at a position different from position coordinates of said first and second alignment mark patterns.

15. A method of forming a pattern of a multilayer type semiconductor device according to claim 8, wherein said step of measuring the first error of said first exposure apparatus includes the step of comparing
 a difference between position coordinates of said reference mark and designed position coordinates of said first alignment mark, with
 a difference between position coordinates of said reference mark and position coordinates of said first alignment mark formed on said first layer.

16. A method of forming a pattern of a multilayer type semiconductor device according to claim 8, wherein said step of measuring the second error of the second exposure apparatus includes the step of comparing
 a difference between position coordinates of said reference mark and designed position coordinates of said second alignment mark, with
 a difference between position coordinates of said reference mark and position coordinates of said second alignment mark formed on said second layer.

17. A method of forming a pattern of a multilayer type semiconductor device including a plurality of chip regions arranged in a matrix on a semiconductor wafer, comprising the steps of:
 forming a first layer on said semiconductor wafer;
 forming a first resist film on said first layer;
 positioning by a stage having said semiconductor wafer placed thereon and exposing an image of a predetermined reference mark at a predetermined position in predetermined regions selected from said chip regions;
 exposing an image of a first pattern including a first alignment mark corresponding to said reference mark onto all of said chip regions with a first exposure apparatus;
 developing said first resist film;
 patterning said first layer image using said developed first resist film as a mask;
 forming a second layer on said patterned first layer;
 forming a second resist film on said second layer;
 measuring with a second exposure apparatus a position of the first alignment mark on the chip region of a predetermined position formed by patterning of said first layer for positioning said semiconductor wafer at a predetermined position of the optical system of said second exposure apparatus;
 comparing a position of said reference mark with a position of the first alignment mark, both formed by patterning of said first layer in said selected chip region, for measuring a first error of said first exposure apparatus;
 forming a third layer on said patterned second layer;
 forming a third resist film on said third layer;
 measuring with a third exposure apparatus a position of the second alignment mark on the chip region of a predetermined position formed by patterning of said second layer for positioning said semiconductor wafer at a predetermined position of the optical system of said third exposure apparatus;
 comparing a position of said reference mark in said selected chip region with a position of said second alignment mark for measuring a second error of said second exposure apparatus;
 exposing with said third exposure apparatus onto the surface of said third resist film a third pattern image including a third alignment mark corresponding to said reference mark after carrying out correction based on said second error;
 developing said third resist film; and
 patterning said third layer using said developed third resist film as a mask.

18. An exposure method of a multilayer type semiconductor device according to claim 17, wherein said step of exposing the image of said reference mark includes the step of exposing vicinities of four corners of said selected chip regions.

19. A method of forming a pattern of a multilayer type semiconductor device according to claim 17, wherein said step of exposing the image of said first alignment mark pattern includes the step of exposing the vicinity of said reference mark.

20. A method of forming a pattern of a multilayer type semiconductor device according to claim 17, wherein said step of exposing the pattern image of the third alignment mark pattern includes the step of exposing the vicinity of said reference mark at a position different from position coordinates of said first and second alignment marks.

21. A method of forming a pattern of a multilayer type semiconductor device according to claim 17, wherein said step of measuring the second error of the second exposure apparatus includes the step of comparing a difference between position coordinates of said reference mark and designed position coordinates of said second alignment mark, with a difference between position coordinates of said reference mark and position coordinates of said second alignment mark formed on said second layer.

* * * * *